United States Patent
Bae et al.

(10) Patent No.: US 7,132,714 B2
(45) Date of Patent: Nov. 7, 2006

(54) VERTICAL CARBON NANOTUBE-FIELD EFFECT TRANSISTOR AND METHOD OF MANUFACTURING THE SAME

(75) Inventors: Eun-ju Bae, Gyeonggi-do (KR); Yo-sep Min, Gyeonggi-do (KR); Wan-jun Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 142 days.

(21) Appl. No.: 11/009,145

(22) Filed: Dec. 13, 2004

(65) Prior Publication Data

US 2005/0156203 A1    Jul. 21, 2005

(51) Int. Cl.
*H01L 29/76* (2006.01)
(52) U.S. Cl. .................. 257/329; 257/289; 438/156
(58) Field of Classification Search ............ 257/20, 257/289, 329; 438/156; 977/742
See application file for complete search history.

(56) References Cited

U.S. PATENT DOCUMENTS

| | | | |
|---|---|---|---|
| 6,515,325 B1 * | 2/2003 | Farnworth et al. ........... | 257/296 |
| 6,566,704 B1 * | 5/2003 | Choi et al. ................... | 257/314 |
| 6,740,910 B1 * | 5/2004 | Roesner et al. ............. | 257/213 |
| 6,930,343 B1 * | 8/2005 | Choi et al. ................... | 257/296 |

OTHER PUBLICATIONS

Sander J. Tans et al., "Room-temperature transistor based on a single carbon nanotube", NATURE © Macmillan Publishers Ltd., vol. 393, May 7, 1998, pp. 49-52.

K. Rim et al., "Mobility Enhancement in Strained Si NMOSFETs with $HfO_2$ with $HfO_2$ Gate Dielectrics", IEEE 2002 Symposium On VLSI Technology Digest of Technical Papers, pp. 12-13.

Sang Hyun Oh et al., 50 nm Vertical Replacement-Gate (VRG) pMOSFETs, IEEE, IEDM 00-65, pp. 3.6.1-3.6.4.

Digh Hisamoto et al., "FinFET—A Self-Aligned Double-Gate MOSFET Scalable to 20 nm", IEEE Transactions on Electron Devices, vol. 47, No. 12, Dec. 2000, pp. 2320-2325.

(Continued)

*Primary Examiner*—Sara Crane
(74) *Attorney, Agent, or Firm*—Buchanan Ingersoll & Rooney PC

(57) ABSTRACT

Provided are a vertical carbon nanotube field effect transistor (CNTFET) and a method of manufacturing the same. The method includes: forming a first electrode on a substrate; forming a stack of multiple layers ("multi-layer stack") on the first electrode, the multiple layers including first and second buried layers and a sacrificial layer interposed between the first and second buried layers; forming a vertical well into the multi-layer stack; growing a CNT within the well; forming a second electrode connected to the CNT on the multi-layer stack into which the well has been formed; forming a protective layer on the second electrode; removing the sacrificial layer and exposing the CNT between the first and second buried layers; forming a gate insulating layer on the exposed surface of the CNT; and forming a gate enclosing the CNT on the gate insulating layer. The CNTFET and manufacturing method maximize the effect of electric field produced by the gate due to the channel completely enclosed by the gate while improving a ratio Ion/Ioff of on-current to off-current by fully depleting a depletion layer formed in the channel.

13 Claims, 10 Drawing Sheets

OTHER PUBLICATIONS

Samuel K.H. Fung et al., "Gate length scaling accelerated to 30nm regime using ultra-thin film PD-SOI Technology", IEEE 2001, IEDM 01-629, pp. 29.3.1-29.3.4.

Georg S. Duesberg et al., "Growth of Isolated Carbon Nanotubes with Lithographically Defined Diameter and Location", 2003 American Chemical Society, Published on Web Jan. 25, 2003, Nano Letters 2003, vol. 3, No. 2, pp. 257-259.

Jack P. Denton et al., "Fully Depleted Dual-Gated Thin-Film SOI P-MOSFET's Fabricated in SOI Islands with an Isolated Buried Polysilicon Backgate", IEEE Electron Device Letters, vol. 17, No. 11, Nov. 1996, pp. 509-511.

Dr. W.B. Choi et al., "Selective Growth of Carbon Nanotubes on Pre-patterned Porous Anodic Aluminum Oxide", Advanced Materials, 14, No. 4, Feb. 19, 2002, pp. 277-279.

Yuegang Zhang et al., "Electric-field-directed growth of aligned single-walled carbon nanotubes", Applied Physics Letters, vol. 79, No. 19, Nov. 5, 2001, pp. 3155-3157.

\* cited by examiner

VERTICAL CARBON NANOTUBE-FIELD EFFECT TRANSISTOR AND METHOD OF MANUFACTURING THE SAME

BACKGROUND OF THE INVENTION

Priority is claimed to Korean Patent Application No. 2003-38521, filed on Jun. 14, 2003, in the Korean Intellectual Property Office, the disclosure of which is incorporated herein in its entirety by reference.

1. Field of the Invention

The present invention relates to a vertical carbon nanotube (CNT)-field effect transistor (FET) and a method of manufacturing the same, and more particularly, to a vertical CNT-FET employing a CNT channel surrounded by a gate and a gate insulating layer and a method of manufacturing the same.

2. Description of the Related Art

As the integration density of semiconductor devices increases, traditional complementary metal oxide semiconductor (CMOS) technology reaches limits of scaling. High integration, high performance, and low power dissipation are achieved by reducing the dimensions of CMOS devices. This trend comes with decreases in the width and length of a gate electrode, an isolation area between unit elements, and thickness and junction depth of a gate insulating layer.

Good gate controllability must be provided by maximizing a ratio of on-current to off-current for scaling CMOS devices. According to the 2001 International Technology Roadmap for Semiconductors (ITRS), various three-dimensional (3-D) silicon (Si) transistors are being explored to improve drive current. These include ultra-thin body fully depleted silicon-on-insulator (UTB-FD SOI) transistors on a SOI substrate [S. Fung et al., *IEDM*-2000, p.629], band-engineered transistors [K. Rim, et al., *VLSI* 2002 page 12] that uses a strained Si channel to increase electron mobility, vertical transistors [Oh, et al., *IEDM*-2000, page 65], Fin-FETs [Hisamoto, et al., *IEEE Trans. On Electron Device* 47, 2320 (2000)], and double-gate transistors [Denton, et al., *IEEE Electron Device Letters* 17, 509 (1996)].

However, in a Si transistor employing a 3-D gate structure, it is difficult to modify the structure of a gate in such a manner that maximizes the effect of electric field produced by a gate. In particular, a process for forming a 3-D gate structure becomes complicated since a Si substrate or Si layer with a 3-D structure produced by deposition and patterning is used as a channel.

In recent years, a transistor employing a CNT as a channel has been proposed to overcome scaling limits encountered by Si devices. Tans and Dekker reported a room-temperature transistor based on a CNT [Tans, et al., *Nature* 393, 49 (1998)]. Particularly, research is being actively conducted to apply CNT growth in horizontal direction [Hongjie Dai, et al., *Appl. Phys. Lett.* 79, 3155 (2001)] and CNT growth from nanoholes in vertical direction [Choi, et al., *Adv. Mater.* 14, 27 (2002); Duesberg, et al., *Nano Letters*] to devices. The primary challenge of this research is to develop a CNT transistor structure that is easy to fabricate and provides good gate controllability and a method for fabricating the same.

SUMMARY OF THE INVENTION

The present invention provides a vertical carbon nanotube (CNT)-field effect transistor (FET) with a CNT channel completely surrounded by a gate and which is easy to fabricate and provides improved gate controllability and a method of manufacturing the same.

According to an aspect of the present invention, there is provided a CNT-FET including: a first electrode formed on a substrate; a CNT aligned vertically with respect to the first electrode; a second electrode overlying the CNT; a first buried layer overlying the first electrode; a second buried layer that is separated by a predetermined distance from the first buried layer and underlies the second electrode; a gate insulating layer formed along a portion of the CNT exposed between the first and second buried layers; and a gate enclosing the gate insulating layer between the first and second buried layers.

According to another aspect of the present invention, there is provided a method of manufacturing a CNT-FET including the steps of: forming a first electrode on a substrate; forming a stack of multiple layers ("multi-layer stack") on the first electrode, the multiple layers including first and second buried layers and a sacrificial layer interposed between the first and second buried layers; forming a vertical well into the multi-layer stack; growing a CNT within the well; forming a second electrode connected to the CNT on the multi-layer stack into which the well has been formed; forming a protective layer on the second electrode; removing the sacrificial layer and exposing the CNT between the first and second buried layers; forming a gate insulating layer on the exposed surface of the CNT; and forming a gate enclosing the CNT on the gate insulating layer.

The first and second buried layers can be made from borosilicate glass (BSG). In the step of forming the gate insulating layer, a gate insulating material may be deposited over the entire surface of the multi-layer stack including the exposed surface of the CNT.

The gate insulating layer is made from silicon nitride or silicon oxide. The step of forming the gate may include stacking a metal layer for the gate, forming a protective layer on the metal layer, and etching the protective layer, the metal layer, and the second buried layer in a predetermined pattern. In this case, a gate material may be deposited using chemical vapor deposition (CVD) or atomic layer deposition (ALD). For more effective growth of CNT, the method can further include forming a catalytic layer on the surface of the first electrode.

The CNT used as a channel of the transistor eliminates the need for a doping process and has better electron mobility than silicon.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
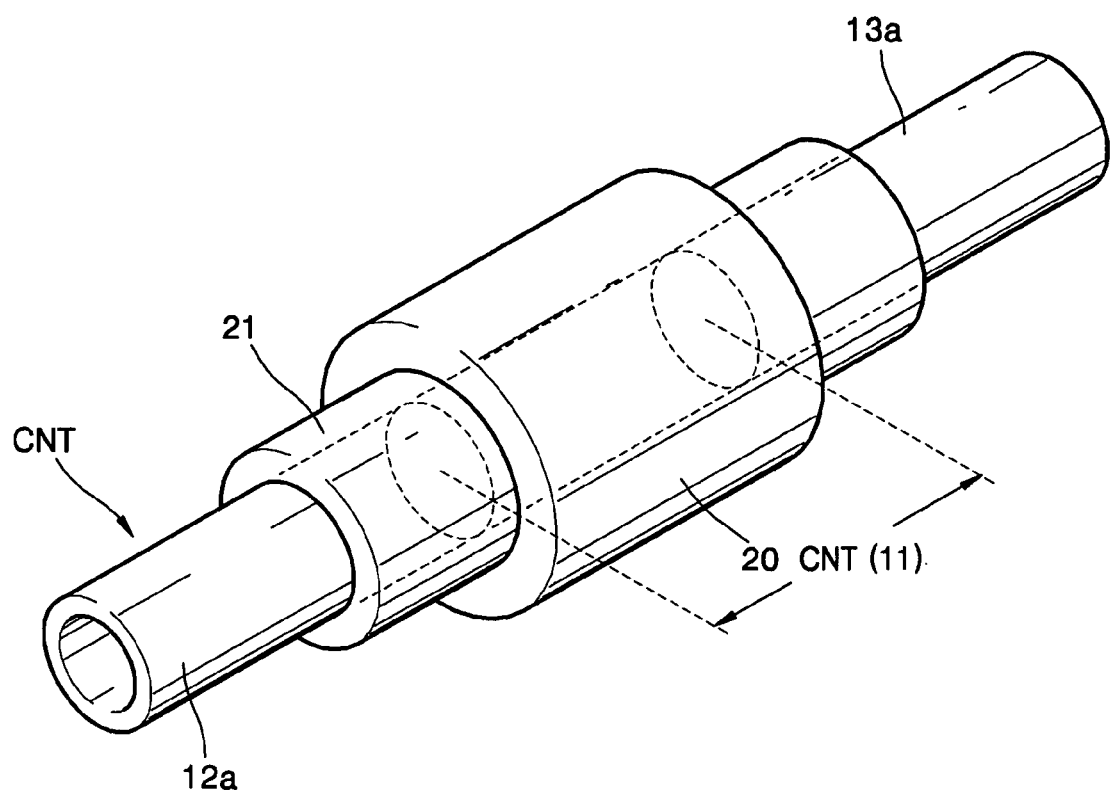
FIG. 1A explains the concept of a transistor employing a cylindrical carbon nanotube (CNT) as its channel according to the present invention.
Figure 1B:
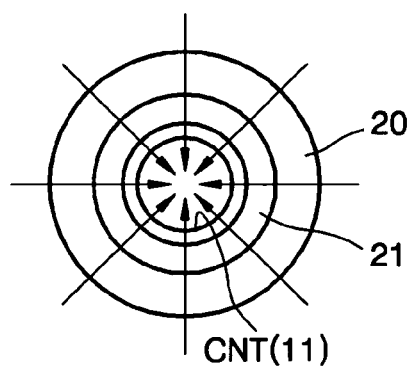
FIG. 1B is a vertical cross-sectional view of the transistor shown in FIG. 1.
Figure 2A:
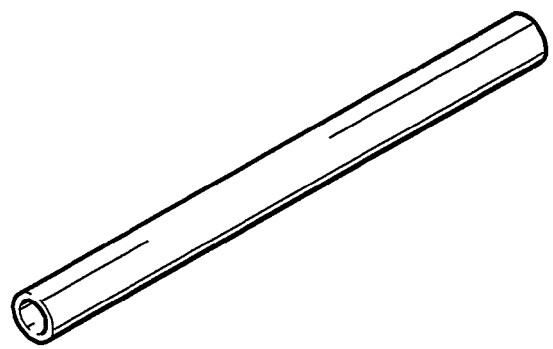
FIGS. 2A and 2B are schematic perspective views of CNTs in a transistor according to the present invention and FIGS. 2C and 2D are schematic perspective views of CNT bundles in a transistor according to the present invention.
Figure 2B:
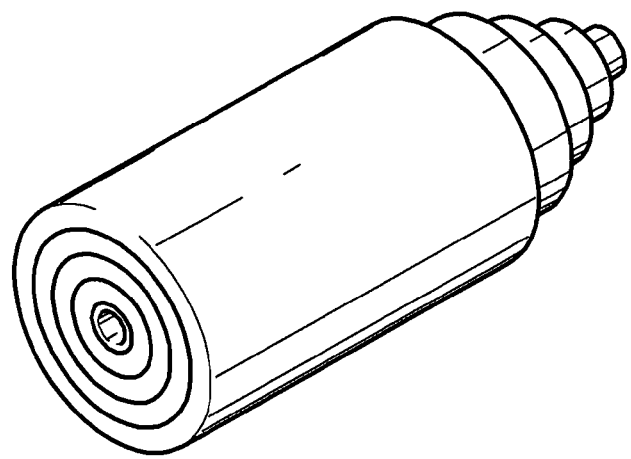
Figure 2C:
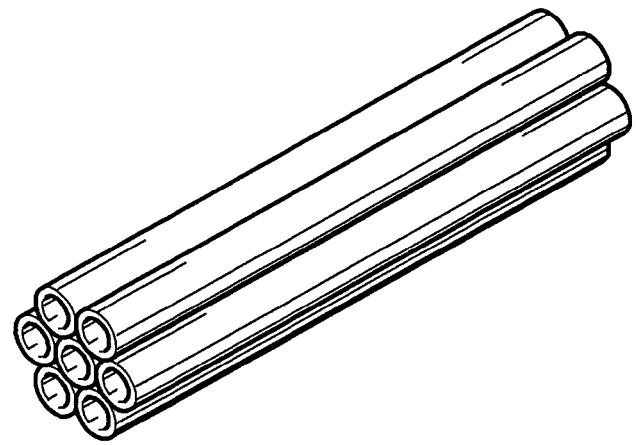
Figure 2D:
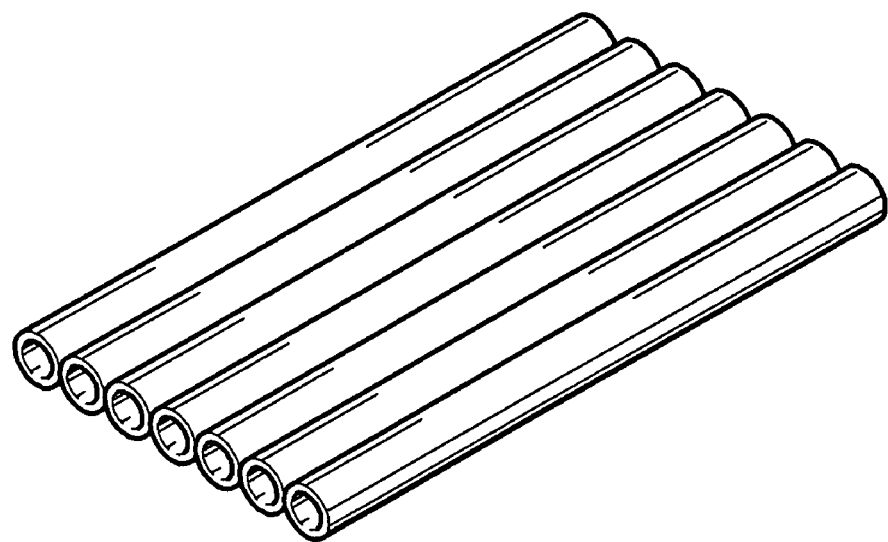

Referring to FIGS. 1A and 1B, a carbon nanotube (CNT) includes a channel region 11 covered by a gate 20, around which an electric field E is created, and a source 12a and a drain 13a that are placed at either end of the CNT and serve as a simple electrical path. The channel 11, the source 12a, and the drain 13a are defined by the gate 20 enclosing the middle portion of the CNT. A gate insulating layer 21 is interposed between the gate 20 and the channel 11.

Referring to FIG. 1B, the transistor structure in which the channel 11 is completely enclosed by the gate 20 allows effective creation of an electric field and maximum electric-field effect. Furthermore, the transistor structure maximizes a ratio (Ion/Ioff) of on-current to off-current since a depletion layer formed in the channel 11 by an electric field is isolated from a substrate.

Depending on a manufacturing process, the CNT comes in common forms as shown in FIGS. 2A–2D. FIGS. 2A–2D respectively show a single-wall CNT (SWNT), a multi-wall CNT (MWNT), a CNT bundle consisting of many SWNTs arranged in a circular bundle, and a CNT bundle consisting of many SWNTs arranged in a linear pattern. In the present exemplary embodiment, the CNT bundle arranged in a linear pattern shown in FIG. 2D may be used as a channel.

Figure 3:
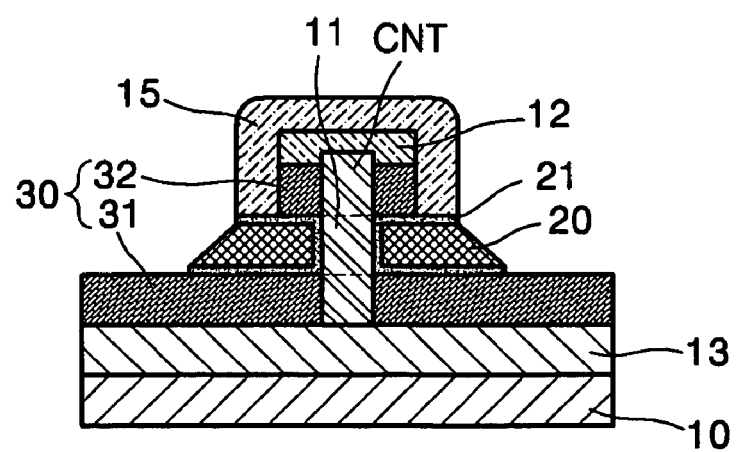
FIG. 3 is a schematic cross-sectional view of a CNT transistor with a CNT enclosed by a gate according to an embodiment of the present invention.

FIG. 3 is a schematic cross-sectional view of a transistor according to an embodiment of the present invention. Referring to FIG. 3, the transistor includes a first electrode 13 acting as a drain formed on a substrate 10, a CNT acting as a channel 11 aligned vertically with respect to the first electrode 13, and a second electrode 12 acting as a source formed on the CNT. While the channel 11 that is the middle portion of the CNT is enclosed by the gate 20, the remaining portion is shielded by a buried layer 30 acting as a spacer made of an insulating material to protect and support the CNT. A gate insulating layer 21 is formed between the gate 20 and the channel 11 and can extend onto the surfaces of the first and second electrodes 13 and 12 acting as the drain and the source, respectively, while surrounding the CNT channel 11.

The buried layer 30 includes a first buried layer 31 interposed between the gate 20 and the first electrode 13 and a second buried layer 32 interposed between the gate 20 and the second electrode 12. Here, the gate insulating layer 21 is formed between the first and second buried layers 31 and 32 and isolates the gate 20 from the buried layer 30. While it is described above that the first and second electrodes 13 and 12 respectively act as the drain and the source, they can respectively act as the source and drain.

Furthermore, a catalytic layer (not shown) can be formed for growth of CNT on the surface of the first electrode 13. Though a CNT can be grown without the presence of the catalytic layer, the crystallinity (quality) of a CNT grown without the catalytic layer is lower than that of a CNT grown in the presence of the catalytic layer.

Due to the structure in which the gate 20 completely encloses the channel 11 that is the middle portion of the CNT, the effect of an electric field around the channel 11 is maximized and a fully depleted depletion layer is obtained by an electric field produced by the gate 20, thereby maximizing a ratio Ion/Ioff.

A vertical CNT field effect transistor (FET) and a method of manufacturing the same will now be described with reference to FIGS. 4A–4L. Hereinafter, since the scope of the present invention is not limited by common technologies in a method of manufacturing a semiconductor device or a layer formation process, detailed descriptions thereof will not be given.

Figure 4A:
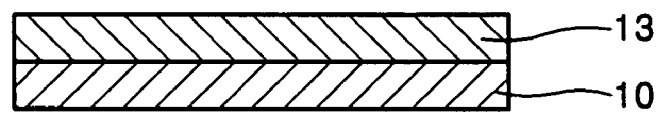
FIGS. 4A–4L show a process of manufacturing a transistor according to an embodiment of the present invention.
Figure 4B:
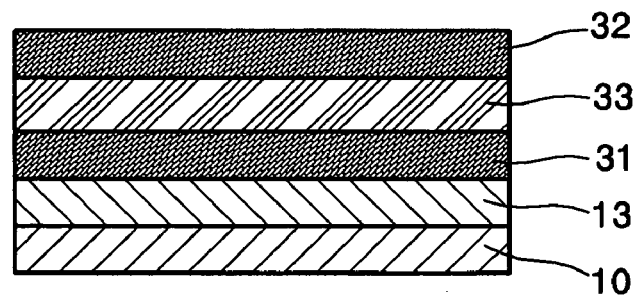

Referring to FIG. 4A, a metal is deposited on a substrate 10 and then patterned to form a first electrode 13. A catalytic layer may be formed on the surface of the first electrode 13. Referring to FIG. 4B, a three-layer structure consisting of layers 31, 33, and 32 of insulating materials is formed on the first electrode 13. While the intermediate layer 33 acting as a sacrificial layer can be made of silicon dioxide ($SiO_2$), the upper and lower layers are the first and second buried layers 31 and 32 in the buried layer 30 described above, respectively, and may be made of borosilicate glass (BSG). The intermediate layer 33 has high etching selectivity with respect to the first and second buried layers 31 and 32.

Figure 4C:
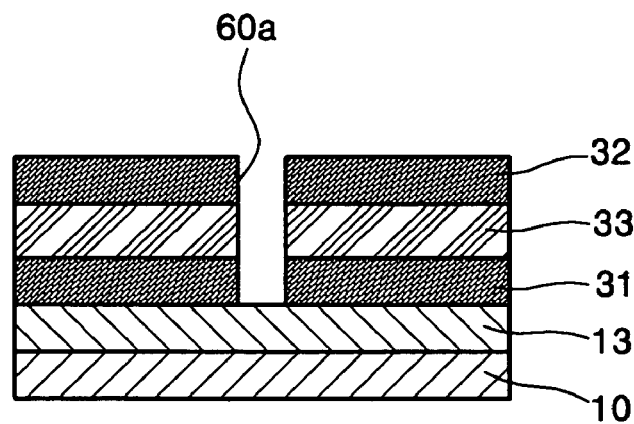
Figure 4D:
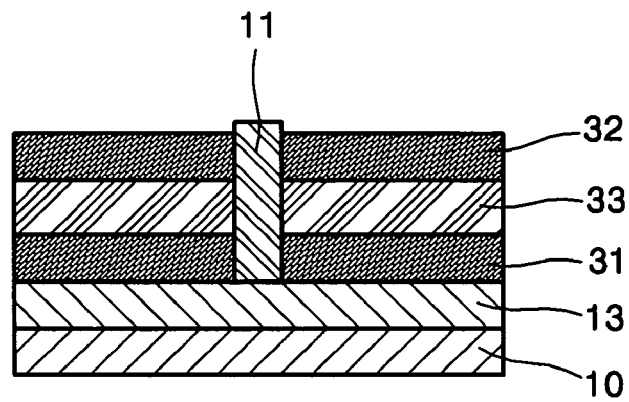

Referring to FIG. 4C, a central portion of the multi-layer stack structure is etched to form a well 60a extending downward to the first electrode 13. The surface of the first electrode 13 or a catalytic layer (not shown) formed on top of the first electrode 13 is exposed on the bottom of the well 60a. Referring to FIG. 4D, a CNT 11 is grown within the well 60a by a common technique such as chemical vapor deposition (CVD) or electrophoresis.

Figure 4E:
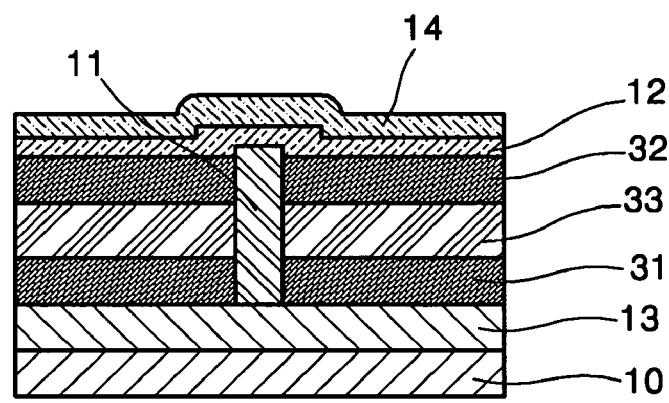

As shown in FIG. 4E, a metal and an insulating material are sequentially stacked on the second buried layer 32 made of insulating material to form a second electrode 12 and a first protective layer 14, respectively. While the second electrode 12 may be made from gold, nickel, or aluminum, the first protective layer 14 may be made from silicon nitride ($Si_3N_4$) or $SiO_2$.

Figure 4F:
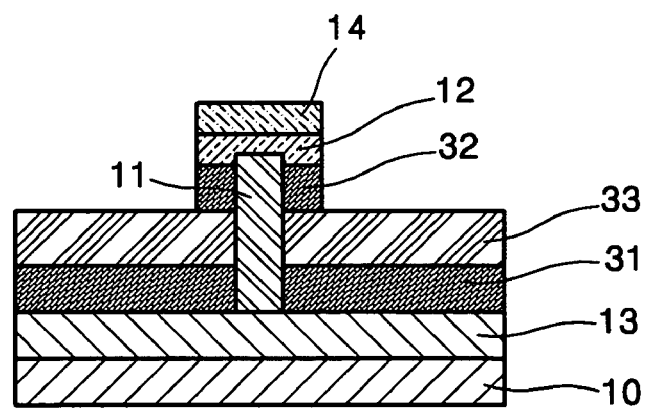
Figure 4G:
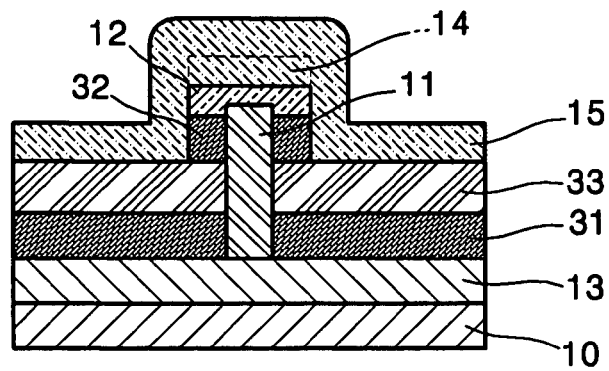

Referring to FIG. 4F, the first protective layer 14, the second electrode 12, and the second buried layer 32 are etched in a predetermined pattern. As shown in FIG. 4G, an insulating material is deposited over the entire surface of the multi-layer stack structure to form a second protective layer 15 using the same material as the first protective layer 14 such as $Si_3N_4$ or $SiO_2$.

Figure 4H:
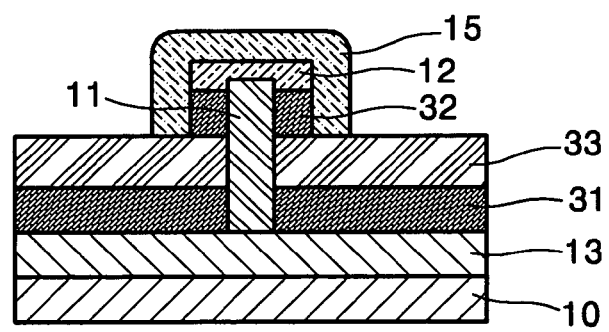
Figure 4I:
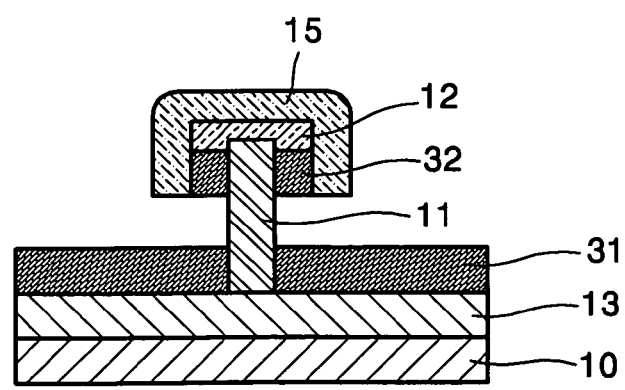

Referring to FIG. 4H, a portion of the second protective layer 15 not enclosing the CNT channel 11 is removed, so the second protective layer 14 remains only on the top and sides of the second electrode 12 and the sides of the second buried layer 32. As shown in FIG. 4I, the intermediate layer 33 acting as a sacrificial layer is removed by wet etching or dry etching (preferably, wet etching) to expose the CNT channel 11 between the first and second buried layers 31 and 32.

Figure 4J:
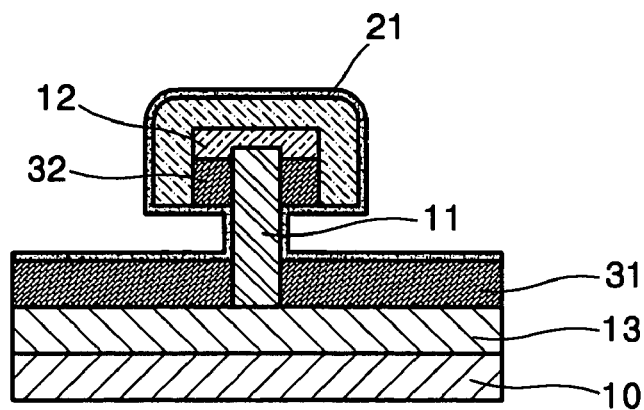
Figure 4K:
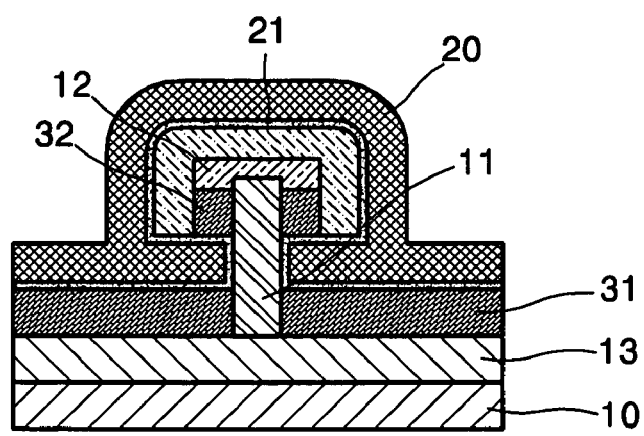

Referring to FIG. 4J, a high-dielectric constant gate insulating layer 21 is formed on the exposed surface of the multi-layer stack formed on the substrate 10. In this case, the gate insulating layer 21 is formed from $Si_3N_4$ or $SiO_2$ using atomic layer deposition (ALD) or CVD demonstrating excellent step coverage. As shown in FIG. 4K, a gate material layer 20 is formed by CVD or ALD on the entire exposed surface of the stack structure, and in particular, including the middle portion of the CNT channel 11 exposed by removing the intermediate layer 33.

Figure 4L:
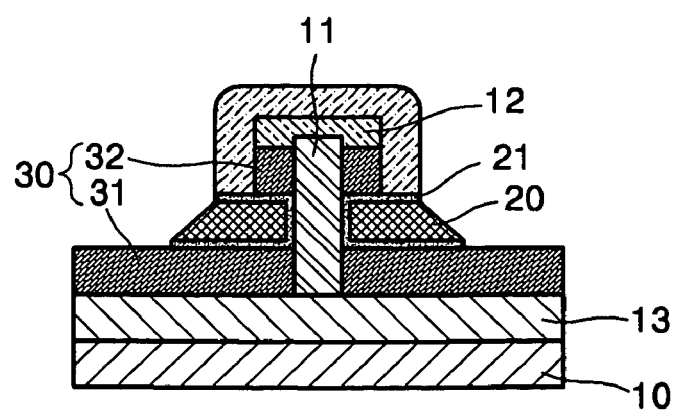

Referring to FIG. 4L, the gate material layer 20 is patterned to form a gate 20 only along the CNT channel 11, thereby completing the desired CNT-FET. The above-mentioned process is performed on multiple transistors using a substrate such as a single silicon wafer.

Figure 5A:
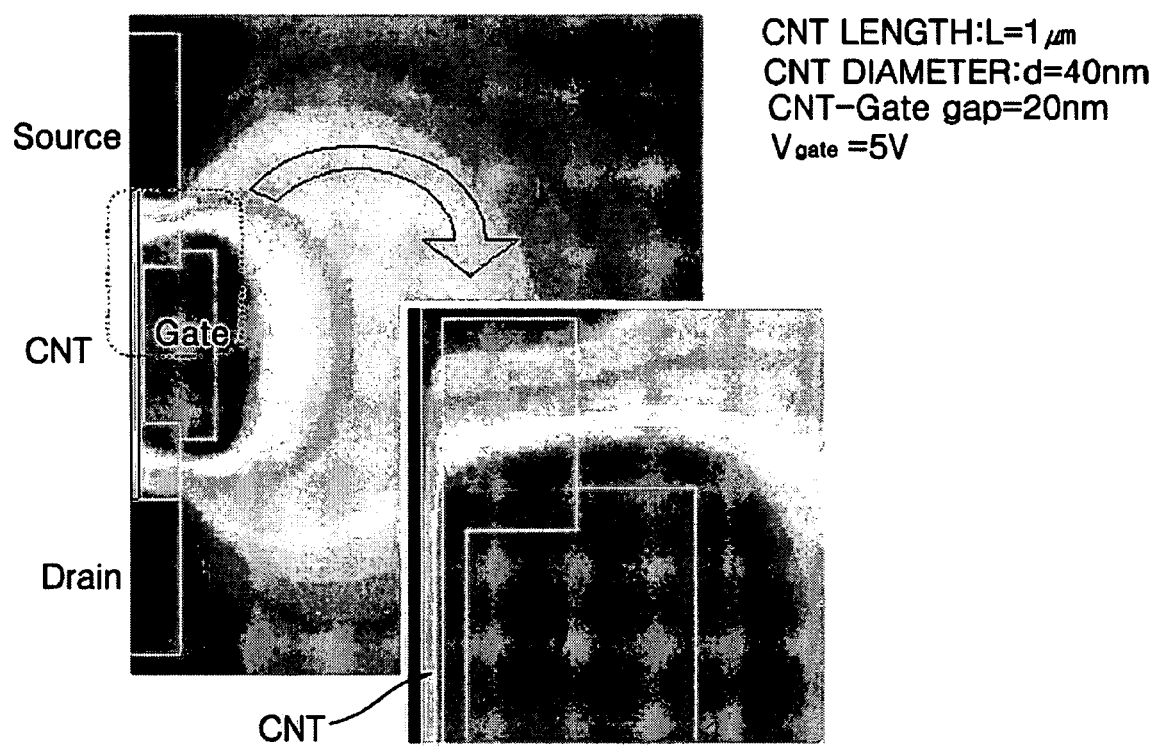
FIG. 5A shows distribution of electric potential around a CNT in a transistor according to the present invention.
Figure 5B:
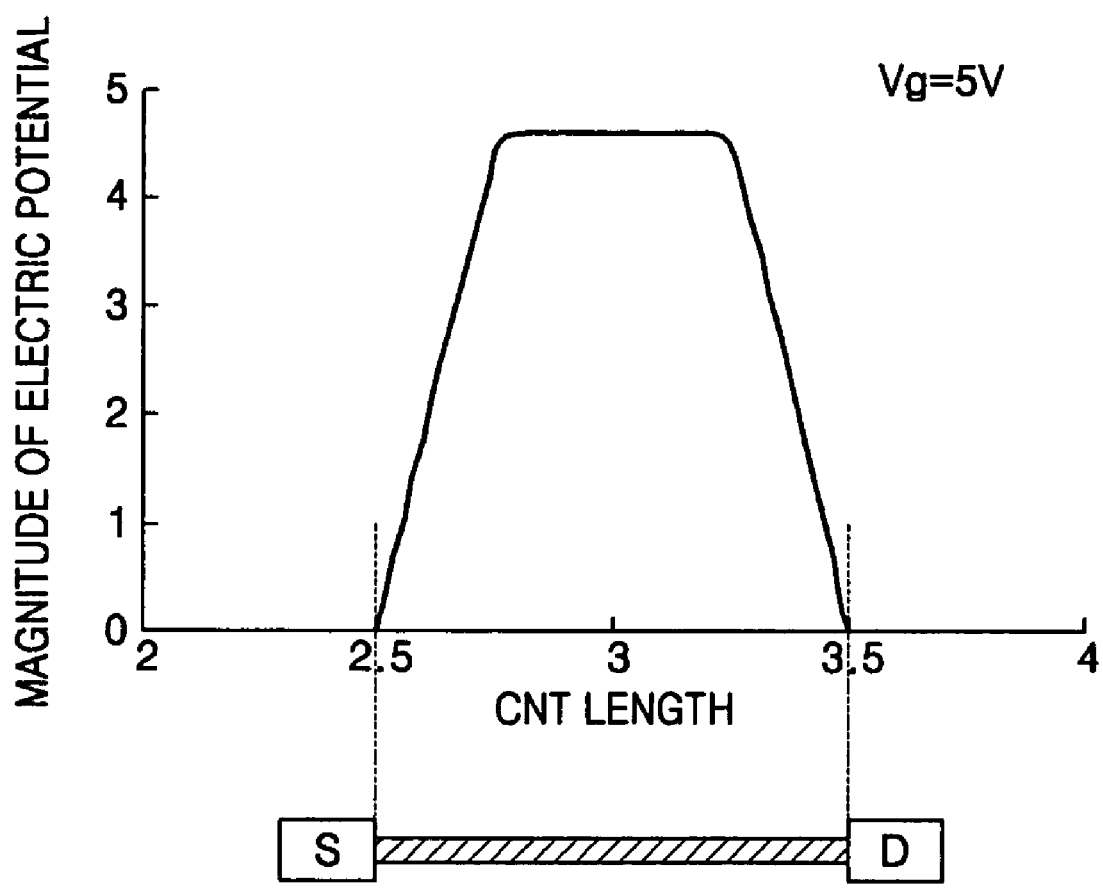
FIG. 5B is a graph showing the amplitude of electric potential that varies across the surface of a CNT in a transistor according to the present invention.

FIGS. 5A and 5B show distribution of electric potential for a transistor according to the present invention. The length and diameter of a CNT are set to 1 µm and 40 nm, respectively, a gate insulating layer enclosing the CNT is made of silicon oxide with a thickness of 20 nm, and a gate voltage $V_{gate}$ is 5 V. Since these numerical values are used only for description of an exemplary embodiment, other values can be used. For example, an electric field may be locally created around the CNT in a transistor configured as shown in FIG. 3 but will not significantly affect a gate node, a source node, and a drain node. As is evident from FIG. 5B, when a gate voltage $V_g$ is 5 V, the potential across the surface of a CNT varies from a maximum potential value of 4.5 V at a point enclosed by a gate to a minimum potential value of zero at opposite ends.

Figure 6A:
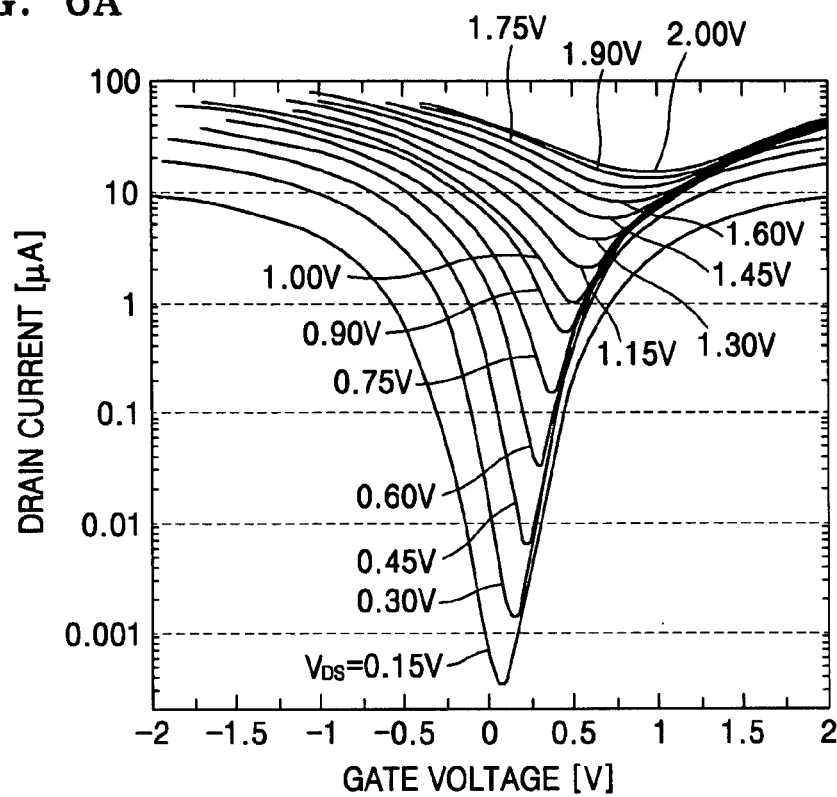
FIG. 6A is a graph of drain current versus gate voltage when a gate-source voltage ($V_{GS}$) varies in a transistor according to the present invention.
Figure 6B:
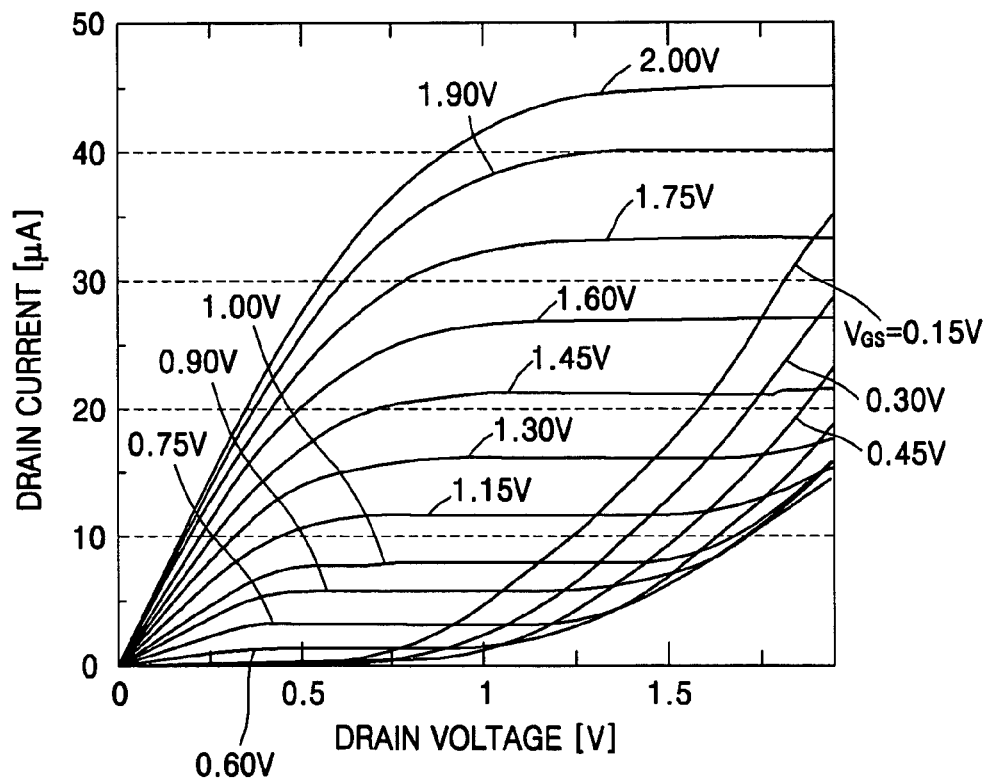
FIG. 6B is a graph of drain current versus drain voltage when a drain-source voltage ($V_{DS}$) varies in a transistor according to the present invention.

FIGS. 6A and 6B show the characteristics of CNT-FETs according to the present invention that have a CNT channel length of 10 µm, a 10-nm thick gate oxide layer composed of zirconium oxide (k=25). Referring FIGS. 6A and 6B, the CNT-FETs according to the present invention have improved device characteristics, comparable to conventional CNT-FETs, which show very poor device characteristics due to low coupling between the gate and the CNT.

A transistor of the present invention uses a cylindrical CNT enclosed by a gate as a channel, thereby maximizing the effect of electric field produced by the gate. The transistor can also maximize a ratio Ion/Ioff since a depletion layer formed in the completely enclosed channel is fully depleted. Furthermore, it is easy to manufacture a cylindrical channel with deposition of the CNT replacing the existing silicon.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A carbon nanotube (CNT) field effect transistor comprising:
    a first electrode formed on a substrate;
    a CNT aligned vertically with respect to the first electrode;
    a second electrode overlying the CNT;
    a first buried layer overlying the first electrode;
    a second buried layer that is separated by a predetermined distance from the first buried layer and underlies the second electrode;
    a gate insulating layer formed along a portion of the CNT exposed between the first and second buried layers; and
    a gate enclosing the gate insulating layer between the first and second buried layers.

2. The transistor of claim 1, wherein the gate insulating layer extends onto the surfaces of the first and second buried layers.

3. The transistor of claim 1, further comprising a protective layer formed on the second electrode.

4. The transistor of claim 2, further comprising a protective layer formed on the second electrode.

5. The transistor of claim 1, wherein said CNT is selected from a group consisting of a single-wall CNT (SWNT), a multi-wall CNT (MWNT), a CNT bundle consisting of many SWNTs arranged in a circular bundle, and a CNT bundle consisting of many SWNTs arranged in a linear pattern.

6. A method of manufacturing a carbon nanotube (CNT) field effect transistor, the method comprising:
    forming a first electrode on a substrate;
    forming a multiple layer stack on the first electrode, the multiple layers including first and second buried layers and a sacrificial layer interposed between the first and second buried layers;
    forming a vertical well into the multi-layer stack;
    growing a CNT within the well;
    forming a second electrode on the multi-layer stack into which the well has been formed, wherein said second electrode is connected to the CNT;
    forming a protective layer on the second electrode;
    removing the sacrificial layer and exposing the CNT between the first and second buried layers;
    forming a gate insulating layer on the exposed surface of the CNT; and
    forming a gate enclosing the CNT on the gate insulating layer.

7. The method of claim 6, wherein the first and second buried layers are made from borosilicate glass (BSG).

8. The method of claim 7, wherein in the forming of the gate insulating layer, a gate insulating material is deposited over the entire surface of the multi-layer stack including the exposed surface of the CNT.

9. The method of claim 8, wherein the gate insulating layer is made from one of silicon nitride and silicon oxide.

10. The method of claim 6, wherein the forming of the gate comprising:
    providing a metal layer for the gate;
    forming a protective layer on the metal layer; and
    etching the protective layer, the metal layer, and the second buried layer in a predetermined pattern.

11. The method of claim 6, wherein a gate material is deposited using one of chemical vapor deposition and atomic layer deposition.

12. The method of claim 10, wherein a gate metal is deposited using one of chemical vapor deposition and atomic layer deposition.

13. The method of claim 6, further comprising forming a catalytic layer on the surface of the first electrode.

* * * * *

UNITED STATES PATENT AND TRADEMARK OFFICE
CERTIFICATE OF CORRECTION

PATENT NO. : 7,132,714 B2 Page 1 of 1
APPLICATION NO. : 11/009145
DATED : November 7, 2006
INVENTOR(S) : Eun-ju Bae et al.

It is certified that error appears in the above-identified patent and that said Letters Patent is hereby corrected as shown below:

On the title page add the following:

--(30) Foreign Application Priority Data:

June 14, 2003, Republic of Korea, Application No. 2003-38521--

Signed and Sealed this

Twentieth Day of March, 2007

JON W. DUDAS
*Director of the United States Patent and Trademark Office*